(12) United States Patent
Ji et al.

(10) Patent No.: US 12,022,613 B2
(45) Date of Patent: Jun. 25, 2024

(54) PRINTED CIRCUIT BOARD

(71) Applicant: SAMSUNG ELECTRO-MECHANICS CO., LTD., Suwon-si (KR)

(72) Inventors: Yong Wan Ji, Suwon-si (KR); Jin Uk Lee, Suwon-si (KR); Eun Sun Kim, Suwon-si (KR); Young Hun You, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/747,653

(22) Filed: May 18, 2022

(65) Prior Publication Data

US 2023/0030484 A1 Feb. 2, 2023

(30) Foreign Application Priority Data

Jul. 29, 2021 (KR) .................. 10-2021-0099711

(51) Int. Cl.
*H05K 1/11* (2006.01)
*B32B 15/00* (2006.01)
*H05K 1/02* (2006.01)

(52) U.S. Cl.
CPC .............. *H05K 1/115* (2013.01); *B32B 15/00* (2013.01); *H05K 1/0298* (2013.01); *H05K 1/11* (2013.01); *H05K 2201/09854* (2013.01)

(58) Field of Classification Search
CPC .................. H05K 1/115; H05K 1/0298; H05K 2201/09854; H05K 3/4647; H05K 3/0032; H05K 3/108; H05K 3/4623
See application file for complete search history.

(56) References Cited

U.S. PATENT DOCUMENTS

| | | | |
|---|---|---|---|
| 6,252,176 B1 * | 6/2001 | Kuramochi | H05K 1/024 174/262 |
| 8,003,893 B2 * | 8/2011 | Miura | H05K 1/0271 174/251 |
| 8,153,906 B2 * | 4/2012 | Hsu | H01R 13/6585 174/262 |
| 2001/0054766 A1 * | 12/2001 | Dirahoui | H01L 23/5329 257/E23.167 |
| 2010/0101851 A1 * | 4/2010 | Muramatsu | H05K 3/4647 174/262 |

FOREIGN PATENT DOCUMENTS

| | | |
|---|---|---|
| JP | 2010-103435 A | 5/2010 |
| KR | 10-2009-0038758 A | 4/2009 |
| KR | 10-2017-0026965 A | 3/2017 |

\* cited by examiner

*Primary Examiner* — Ishwarbhai B Patel
(74) *Attorney, Agent, or Firm* — Morgan, Lewis & Bockius LLP

(57) ABSTRACT

A printed circuit board includes: a first insulating layer having a recess portion in one surface of the first insulating layer; a first circuit pattern embedded in the first insulating layer and being in contact with a lower surface of the recess portion; a second insulating layer disposed on the one surface of the first insulating layer to be disposed in at least a portion of the recess portion; and a via penetrating through at least a portion of the second insulating layer, disposed in the recess portion, and connected to the first circuit pattern.

19 Claims, 12 Drawing Sheets

# PRINTED CIRCUIT BOARD

CROSS-REFERENCE TO RELATED APPLICATION(S)

This application claims benefit of priority to Korean Patent Application No. 10-2021-0099711 filed on Jul. 29, 2021 in the Korean Intellectual Property Office, the disclosure of which is incorporated herein by reference in its entirety.

TECHNICAL FIELD

The present disclosure relates to a printed circuit board, and particularly, to a printed circuit board including a via with no land or pad.

BACKGROUND

As electronic devices in the information technology (IT) field, including mobile phones, have become lighter, thinner, shorter, and smaller, circuit density has increased and the number of input/output integrated circuits has also increased, and accordingly, circuit patterns applied to package printed circuit boards (PCBs) are increasingly fine in width. In order to achieve microcircuits, large investments in infrastructure and a long development period, which are difficult to readily apply, may be required.

As a key technology for wiring microcircuits, it is necessary to reduce a line width of the circuit pattern and a distance between the circuit patterns. However, a wide pad or land of a via for inter-layer connection is a main factor in creating difficulty in disposing many circuit wirings. Thus, it is required to develop a technology for an inter-layer connection that is not affected by pads or lands, and there is a need for a method of increasing circuit density through structural changes without any additional facility investment or changes in material.

SUMMARY

An aspect of the present disclosure may provide a printed circuit board capable of achieving a microcircuit.

Another aspect of the present disclosure may provide a printed circuit board capable of reducing processing costs and processing time.

Another aspect of the present disclosure may provide a printed circuit board advantageous in improving circuit density.

Another aspect of the present disclosure may provide a printed circuit board capable of preventing defects caused by via plating or delamination.

According to an aspect of the present disclosure, a printed circuit board may include: a first insulating layer having a recess portion in one surface of the first insulating layer; a first circuit pattern embedded in the first insulating layer and being in contact with a lower surface of the recess portion; a second insulating layer disposed on the one surface of the first insulating layer to be disposed in at least a portion of the recess portion; and a via penetrating through at least a portion of the second insulating layer, disposed in the recess portion, and connected to the first circuit pattern.

According to another aspect of the present disclosure, a printed circuit board may include: a first insulating layer having a recess portion in one surface of the first insulating layer; a first circuit pattern embedded in the first insulating layer and being in contact with a lower surface of the recess portion; a second circuit pattern disposed on the one surface of the first insulating layer; and a plurality of vias spaced apart from each other in the recess portion, each connecting the first and second circuit patterns to each other.

According to another aspect of the present disclosure, a printed circuit board may include: a first insulating layer having a recess portion in one surface of the first insulating layer; a second insulating layer disposed on the one surface of the first insulating layer and including a portion disposed in the recess portion; a plurality of first circuit patterns spaced apart from each other in the first insulating layer, and extending from the recess portion; a plurality of second circuit patterns embedded in the second insulating layer; and a plurality of vias spaced apart from each other in the recess portion, and respectively extending from the plurality of first circuit patterns to the plurality of second circuit patterns.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
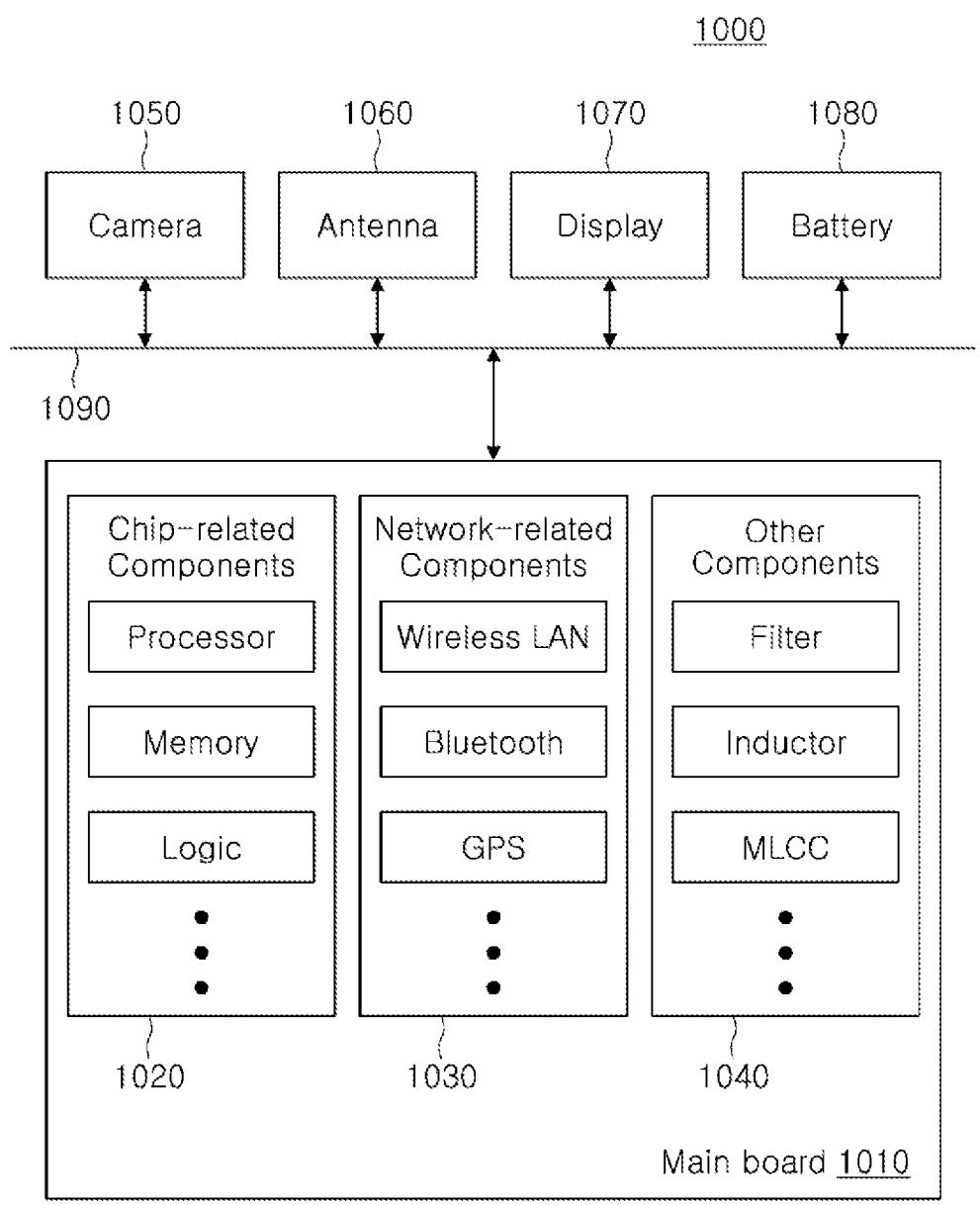
FIG. 1 is a block diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter (ADC) or an application-specific integrated circuit (ASIC). The chip-related components 1020 are not limited thereto, but may also include other types of chip-related components. In addition, these chip-related components may be combined with each other. The chip-related components 1020 may be in the form of a package including the chips described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+ (HSPA+), high speed downlink packet access+ (HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with the chip-related components 1020 to be provided in a package form.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with the chip-related components 1020 and/or the network-related components 1030 to be provided in a package form.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
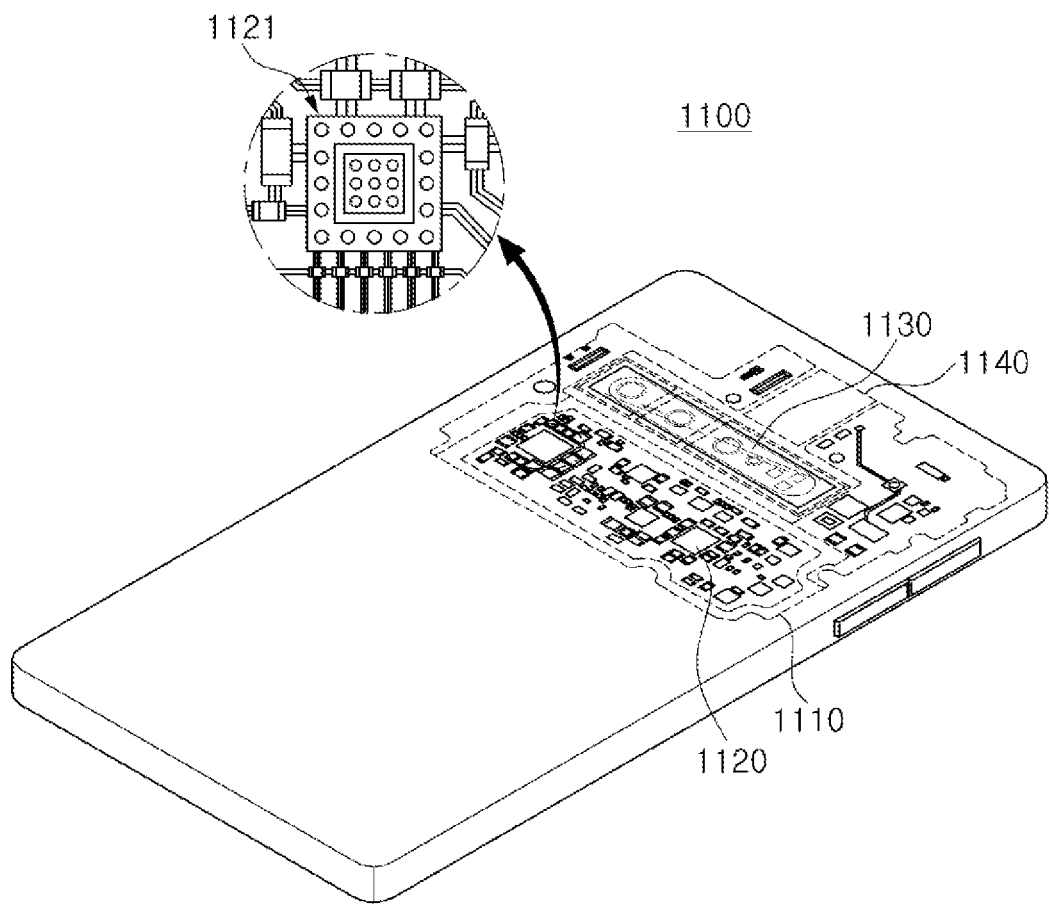
FIG. 2 is a perspective view schematically illustrating an exemplary embodiment of an electronic device.

FIG. 2 is a perspective view schematically illustrating an exemplary embodiment of an electronic device.

Referring to FIG. 2, the electronic device may be, for example, a smartphone 1100. A motherboard 1110 may be accommodated in the smartphone 1100, and various electronic components 1120 may be physically and/or electrically connected to the motherboard 1110. In addition, a camera module 1130, a speaker 1140, and/or the like may also be accommodated in the motherboard 1110. Some of the electronic components 1120 may be the above-described chip-related components, e.g., a printed circuit board 1121 with a plurality of electronic components mounted on a surface thereof, but are not limited thereto. Meanwhile, the electronic device is not necessarily limited to the smartphone 1100, but may be any other electronic device as described above.

Figure 3:
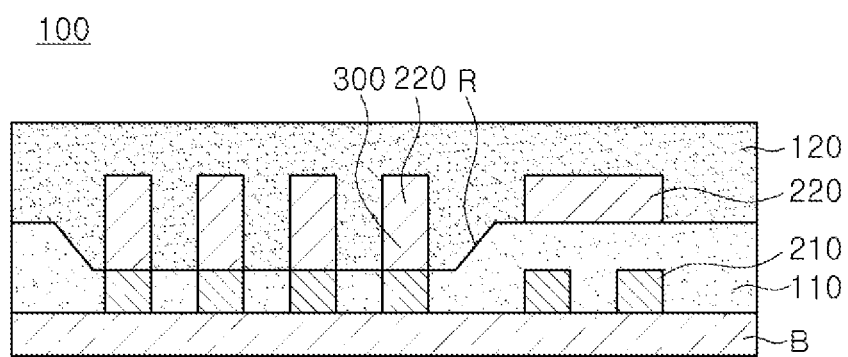
FIG. 3 is a cross-sectional view schematically illustrating an exemplary embodiment of a printed circuit board.

FIG. 3 is a cross-sectional view schematically illustrating an exemplary embodiment of a printed circuit board.

Referring to FIG. 3, a printed circuit board 100 according to an exemplary embodiment may include: a base substrate B; a first circuit pattern 210 disposed on the base substrate B; a first insulating layer 110 disposed on the base substrate B to embed the first circuit pattern 210, with a recess portion R formed therein; a second circuit pattern 220 disposed on the first insulating layer 110; a via 300 disposed in the recess portion R of the first insulating layer 110 to electrically connect the first and second circuit patterns 210 and 220 to each other; and a second insulating layer 120 disposed on the first insulating layer 110 to at least partially fill the recess portion R and at least partially cover the second circuit pattern 220 and the via 300.

The recess portion R may be formed in one surface of the first insulating layer 110 of the printed circuit board 100 according to the exemplary embodiment through a skiving process. The recess portion R may be formed in a typical insulating material processing method such as laser processing to be described later, and at least a portion of the first circuit pattern 210 may be exposed from a lower surface of the recess portion R. Unlike a process for forming respective vias on first circuit patterns 210 for inter-layer connection, the process for forming the recess portion R once as described above makes it possible to secure a space in which the vias 300 are to be disposed, so that the printed circuit board can be manufactured by a simpler process.

Meanwhile, the recess portion R of the printed circuit board 100 according to the exemplary embodiment, which is formed in one surface of the first insulating layer 110 through laser processing, may have a tapered shape. That is, the recess portion R may be tapered to have a smaller width or cross-sectional area as being closer to the other surface of the first insulating layer 110. In addition, a step structure created on one surface of the first insulating layer 110 by the formation of the recess portion R further improves adhesion between the first and second insulating layers 110 and 120, as compared with a structure in which one surface of the first insulating layer 110 is flat.

Meanwhile, the via 300 of the printed circuit board 100 according to the exemplary embodiment, which is disposed through a dry film D (dry film resist) in a manufacturing process to be described later, may have a different shape from a typical via disposed through laser processing. That is, unlike a cylindrical or truncated cone-shaped via formed through laser processing, the via 300 of the present disclosure may have a polygonal shape with corners in a cross section.

Meanwhile, since the via 300 of the printed circuit board 100 according to the exemplary embodiment is not formed through laser processing, the via 300 may have a shape in which upper and lower surfaces thereof have a substantially equal width, rather than a tapered shape. A tapered via based on laser processing has a difference in cross-sectional area between upper and lower surfaces thereof, which may cause a crack in the plating layer due to delamination in a region having a smaller cross-sectional area. In contrast, according to the present disclosure, since the via 300 is formed through a plating process using the dry film D, the aforementioned plating defect can be prevented.

Meanwhile, the first circuit pattern 210 disposed on a lower side of the via 300 of the printed circuit board 100 according to the exemplary embodiment may not need a land. Similarly, the second circuit pattern 220 disposed on an upper side of the via 300 may not need a pad as well because the upper and lower surfaces of the via 300 have a substantially equal cross-sectional area. In general, the pad and the land are formed to have a larger cross-sectional area or volume than a wiring layer for effective connection to the via, occupying a lot of space. According to the present disclosure, a padless or landless structure is proposed as described above to form wiring layers further densely, and no pads and lands make it possible to effectively achieve a microcircuit structure.

Hereinafter, components of the printed circuit board 100 according to the exemplary embodiment will be described with reference to the accompanying drawings.

Referring to FIG. 3, the printed circuit board 100 may include: a base substrate B; a first circuit pattern 210 disposed on the base substrate B; a first insulating layer 110 disposed on the base substrate B to cover the first circuit pattern 210, with a recess portion R formed in one surface thereof; a second circuit pattern 220 disposed on one surface of the first insulating layer 110; a second insulating layer 120 disposed on one surface of the first insulating layer 110 to fill at least a portion of the recess portion R and cover the second circuit pattern 220; and a via 300 penetrating through at least a portion of the second insulating layer 120 to electrically connect the first and second circuit patterns 210 and 220 to each other.

The first and second insulating layers 110 and 120 may be sequentially stacked on the base substrate B. The base substrate B may be a typical printed circuit board including a wiring layer, a via layer, and multiple inter-layer insulating layers.

The recess portion R may be formed in one surface of the first insulating layer 110, and the first circuit pattern 210 may be embedded in the other surface of the first insulating layer 110. The printed circuit board 100 may be in the form of a coreless, padless, and landless board. As described above, a feature of the present disclosure is that, as a configuration for inter-layer connection, the recess portion R is formed once through the skiving process, rather than performing laser processing on each region where the first circuit pattern 210 is exposed to a lower surface of the recess portion R to form a via. The recess portion R may be formed through laser processing (a so-called skiving) to be described below, and by doing so, the first circuit pattern 210 may be partially exposed to the lower surface of the recess portion R. A portion of the first circuit pattern 210 for inter-layer connection may be exposed to the lower surface of the recess portion R, and thus, a plurality of first circuit patterns 210 may be exposed to the lower surface of the recess portion R while being spaced apart from each other. In addition, line widths of a region of the first circuit pattern 210 embedded in the first insulating layer 110 and a region of the first circuit pattern 210 exposed to the lower surface of the recess portion R are not limited, but may be substantially equal. That is, in the printed circuit board 100 of the present disclosure, no separate pad or land may be formed in a region where the first circuit pattern 210 is connected between layers.

In addition, a plurality of first circuit patterns 210 may be exposed to the lower surface of the recess portion R described above. Referring to FIG. 3, there may be four exposed surfaces of first circuit patterns 210 on the lower surface of the recess portion R. In the typical process for forming via holes, the via holes expose the respective circuit patterns disposed on lower sides of the via holes in a one-to-one corresponding manner. In contrast, according to the present disclosure, since the recess portion R is formed once by the skiving process, the process can be further simplified. In one example, the first circuit patterns 210 may include patterns, spaced part from the recess portion R, having upper surfaces covered by the first insulating layer 110.

In addition, the skiving process may be performed until the lower surface of the recess portion R exposes the first circuit pattern 210, so that an upper surface of the first circuit pattern 210 exposed to the lower surface of the recess portion R is coplanar with the lower surface of the recess portion R. In the present disclosure, the term "coplanar" may mean that a sharing surface is formed, and the formation of the sharing surface may be interpreted as not only meaning that the sharing surface is a physically perfectly flat surface, but also meaning that the sharing surface includes even a tolerance that may occur in the process.

The second insulating layer 120 may be disposed on one surface of the first insulating layer 110 to fill at least a portion of the recess portion R. In this case, a step formed on one surface of the first insulating layer 110 due to the recess portion R may cause an anchor effect, thereby improving adhesion between the first and second insulating layers 110 and 120 as compared with that in a case where one surface of the first insulating layer 110 is flat. The second insulating layer 120 may partially cover the second circuit pattern 220 and the via 300 disposed on one surface of the first insulating layer 110.

An insulating material may be used as a material for each of the first and second insulating layers 110 and 120. An example of the insulating material for each of the first and second insulating layers 110 and 120 may include a thermosetting resin such as an epoxy resin, a thermoplastic resin such as a polyimide resin, or a material including an inorganic filler such as silica and/or a reinforcing material such as a glass fiber together with the thermosetting or thermoplastic resin, e.g., prepreg or an Ajinomoto build-up film (ABF). The number of first and second insulating layers 110 and 120 may be larger or smaller than what is illustrated in FIG. 3. If necessary, the first and second insulating layers 110 and 120 may include a photosensitive insulating material.

The first circuit pattern 210 may be disposed on the base substrate B through a plating process and embedded in the other surface of the first insulating layer 110. One surface of the first circuit pattern 210 may be exposed from the lower surface of the recess portion R described above, and the via 300 may be disposed on and contact-connected to the exposed surface of the first circuit pattern 210.

The second circuit pattern 220 may be disposed on one surface of the first insulating layer 110 and covered by the second insulating layer 120. In addition, the second circuit pattern 220 may be integrally formed with the via 300. That is, the second circuit pattern 220 may be integrally formed with the via 300 by plating through a plating process to be described below, and there may be no plating interface between the second circuit pattern 220 and the via 300. The second circuit pattern 220 may be electrically connected to the first circuit pattern 210 through the via 300. In addition, since the second circuit pattern 220 and the via 300 are integrally formed, a side surface of the second circuit pattern 220 and a side surface of the via 300 may be coplanar with each other.

A metal material may be used as a material for each of the first and second circuit patterns 210 and 220, and the metal material may be copper (Cu), aluminum (Al), silver (Ag), tin (Sn), gold (Au), nickel (Ni), lead (Pb), titanium (Ti), or an alloy thereof. The first and second circuit patterns 210 and 220 may perform various functions depending on design. For example, the first and second circuit patterns 210 and 220 may include ground patterns, power patterns, signal patterns, and the like. Each of these patterns may be in the form of a line, a plane, or a pad. The first circuit pattern 210 may be formed through a plating process such as an additive process (AP), a semi AP (SAP), a modified SAP (MSAP), or tenting (TT), and may resultantly include a seed layer, which is an electroless plating layer, and an electrolytic plating layer formed based on the seed layer. If necessary, the first circuit pattern 210 may further include a primer copper foil. The number of layers of the first and second circuit patterns 210 and 220 may be larger or smaller than what is illustrated in FIG. 3.

The via 300 may be disposed on the first circuit pattern 210 exposed into the recess portion R through a plating process using a dry film D to be described below. Thus, when there are a plurality of exposed surfaces of first circuit patterns 210 in the recess portion R, a plurality of vias 300 may also be disposed. That is, the vias 300 may be disposed on the plurality of first circuit patterns 210 spaced apart from each other on the lower surface of the recess portion R, respectively.

In addition, since the via 300 is formed by plating using the dry film D, the via 300 of the present disclosure may have a shape in which upper and lower surfaces thereof have a substantially equal cross-sectional area. In the present disclosure, the term "substantially equal" may mean not only being physically perfectly the same but also including a tolerance that may occur in consideration of environments in the actual process. Since the via 300 of the present disclosure does not have a tapered shape based on laser processing, but has a shape in which the upper and lower surfaces thereof have a substantially equal cross-sectional area, defective plating can be prevented. For example, in the tapered via structure, the insulating material may permeate into an interface between plating layers in a region having a smaller cross-sectional area, and the plating layers may be separated from each other, causing a crack and a delamination phenomenon. According to the present disclosure, however, a sufficient interfacial area between the plating layers of the first circuit pattern 210 and the via 300 can be secured, thereby preventing a crack and a delamination phenomenon.

In addition, since the via 300 of the printed circuit board 100 according to the exemplary embodiment is formed by performing a plating process after making a resist layer by exposing and developing the dry film D, rather than through laser processing, a padless and landless structure can be achieved as in the printed circuit board 100 of FIG. 3. The pads and lands refer to a metal layer formed by plating in a larger area to sufficiently secure a thickness and an area of the metal layer in a region to be contacted by laser or a blast material considering that a copper (Cu) layer is damaged during the laser or blast processing for forming a via, and function for electrical connection to other components such as vias among circuit patterns. Accordingly, a wider metal layer is usually disposed in the pad and land region, reducing space utilization. According to the present disclosure, however, pads and lands can be omitted, making it possible to form the first circuit patterns 210 further densely with respect to the same space.

In addition, no pads and lands make it easy to implement the first circuit pattern 210 as a high-density microcircuit pattern. As an example of the high-density circuit, the first circuit patterns 210 of the printed circuit board 100 may have a relatively fine average pitch as compared to those of a wiring layer (not illustrated) in the base substrate B. Here, the pitch may refer to a distance from the center of one conductor pattern to the center of another adjacent conductor pattern in each wiring layer.

In addition, the via 300 of the printed circuit board 100 according to the exemplary embodiment, which is disposed using a dry film D, may have a different shape from a typical via disposed through laser processing. That is, unlike the cylindrical or truncated cone-shaped via disposed through laser processing, whose cross section is circular due to the influence of laser, the via 300 of the present disclosure may have a polygonal shape with corners in a cross section, and may have the same shape as the circuit pattern in terms of design. Accordingly, according to the present disclosure, in a region where the via 300 and the first circuit pattern 210 contact each other, a side surface of the first circuit pattern 210 and a side surface of the via 300 may be coplanar with each other.

A metal material may also be used as a material for each of the vias 300, and the metal material may be copper (Cu), aluminum (Al), silver (Ag), tin (Sn), gold (Au), nickel (Ni), lead (Pb), titanium (Ti), or an alloy thereof. The vias 300 may include signal connection vias, ground connection vias, power connection vias, and the like depending on design. The via 300 may have a substantially equal cross-sectional area from the upper surface to the lower surface thereof. The via 300 may be formed through a plating process, e.g., AP, SAP, MSAP, or TT, and may resultantly include a seed layer, which is an electroless plating layer, and an electrolytic plating layer formed based on the seed layer. The number of layers of the vias 300 may be larger or smaller than what is illustrated in FIG. 3.

Meanwhile, although it is illustrated in FIG. 3 that the vias 300 may have a substantially equal cross-sectional area from the upper surface to the lower surface thereof, the shapes of the vias may be controlled according to various designs by controlling a shape of the dry film D, if necessary, in the process of exposing and developing the dry film D to be described below. Therefore, the shape of the via 300 is not necessarily limited to having a substantially equal cross-sectional area from the upper surface to the lower surface thereof.

Concerning the other overlapping components, what has been described above is identically applicable, and thus, the description thereof will not be repeated.

FIGS. 4 to 10 are process views schematically illustrating an exemplary embodiment of a method for manufacturing the printed circuit board of FIG. 3.

Figure 4:
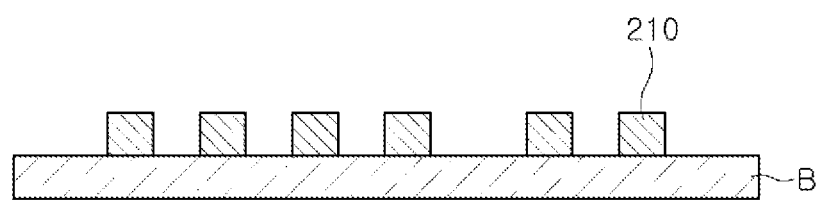
FIGS. 4 to 10 are process views schematically illustrating an exemplary embodiment of a method for manufacturing the printed circuit board of FIG. 3.

Referring to FIG. 4, a first circuit pattern 210 may be disposed on a base substrate B. Although not illustrated, the base substrate B may be an insulating layer supporting the first circuit pattern 210, a printed circuit board in which multiple insulating layers, wiring layers, and vias are formed, or an interposer serving to connect boards to each other.

In a case where the base substrate B is a printed circuit board or an interposer, the first circuit pattern 210 may be electrically connected to a conductor layer in the base substrate B.

Figure 5:
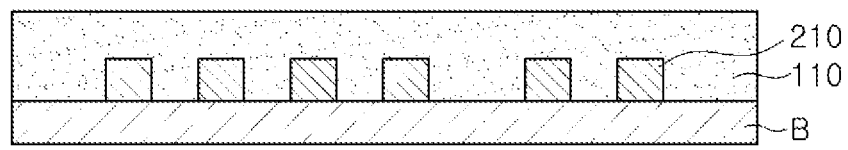

Referring to FIG. 5, a first insulating layer 110 may be disposed on the base substrate B to embed the first circuit pattern 210. In order to fill a space between the first circuit patterns 210, the first insulating layer 110 may include an ABF, which is a material having fluidity before being cured.

Figure 6:
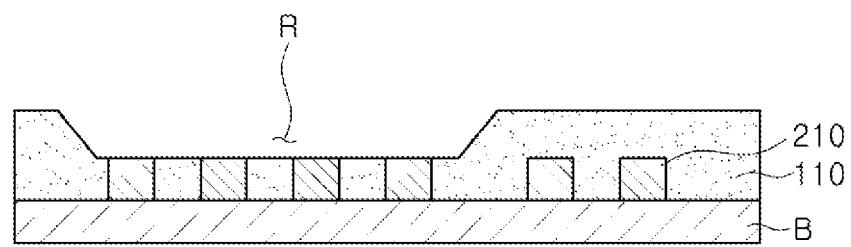
Figure 7:
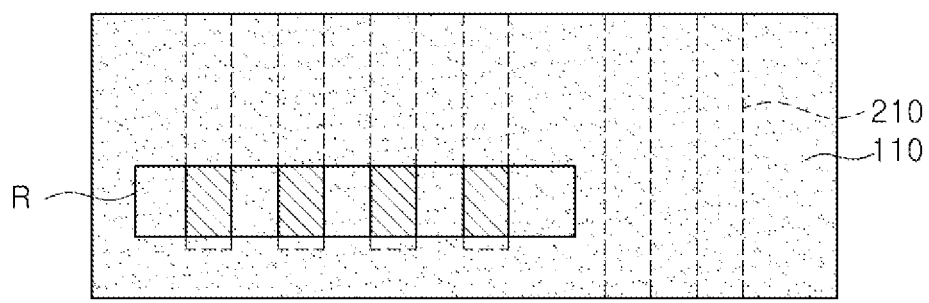

Referring to FIGS. 6 and 7, a recess portion R may be formed in one surface of the first insulating layer 110 through a skiving process using laser. The skiving process refers to a method of processing an object by continuously irradiating laser while shifting a laser irradiation region to extend in one direction. As an example, as illustrated in FIG. 7, which is a plan view conceptively showing the recess R formed in the first insulating layer 210 to expose some portions of the first circuit pattern 210, the recess portion R may extend in a direction perpendicular to a direction in which the first circuit pattern 210 extends.

An upper surface of the first circuit pattern 210 may be exposed to a lower surface of the recess portion R, and the exposed upper surface of the first circuit pattern 210 may form a sharing surface with the lower surface of the recess portion R. Alternatively, in a case where a laser processing time is long, the upper surface of the first circuit pattern 210 may protrude from the lower surface of the recess portion R by a predetermined distance.

Referring to FIG. 7, the rest of the first circuit pattern 210 excluding a region exposed to the recess portion R may be embedded in the first insulating layer 110.

Figure 8:
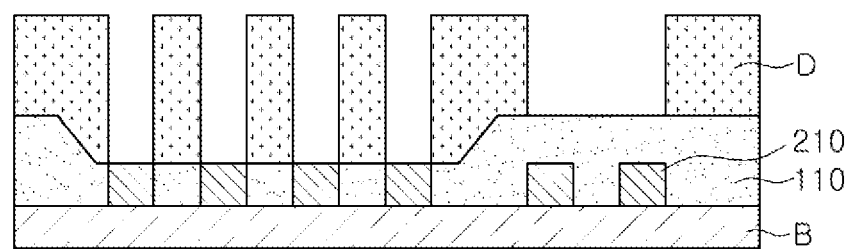

Referring to FIG. 8, a photosensitive resist such as a dry film D may be disposed on one surface of the first insulating layer 110 and in the recess portion R. In the present disclosure, the photosensitive resist is expressed as dry film D, but is not limited thereto, and may be another photosensitive material that is easy to expose and develop.

Thereafter, a partial region of the dry film D may be removed through an exposure/development process. As illustrated in FIG. 8, by developing and removing the dry film D, the upper surface of the first circuit pattern 210 exposed into the recess portion R may be exposed to expose a region of the first insulating layer 110 on which the second circuit pattern 220 is to be disposed.

Figure 9:
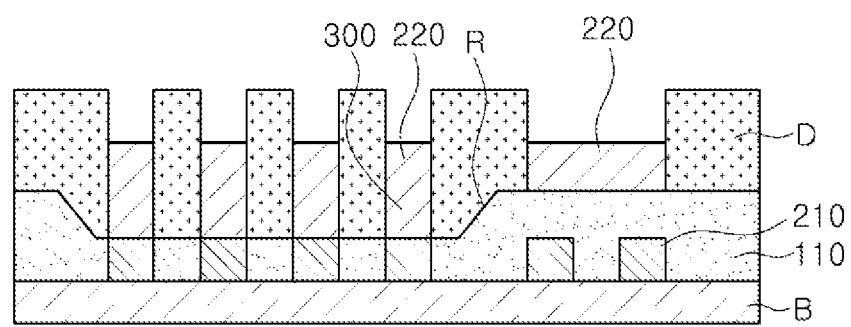

Referring to FIG. 9, a second circuit pattern 220 and a via 300 may be disposed through a plating process in the region where the dry film D is developed. In this case, since the second circuit pattern 220 and the via 300 are disposed through a single plating process, a boundary between the second circuit pattern 220 and the via 300 may be unclear. In addition, since the via 300 is disposed on the first circuit pattern 210 by performing an additional plating process, there may be an interface between respective plating layers of the first circuit pattern 210 and the via 300.

Figure 10:
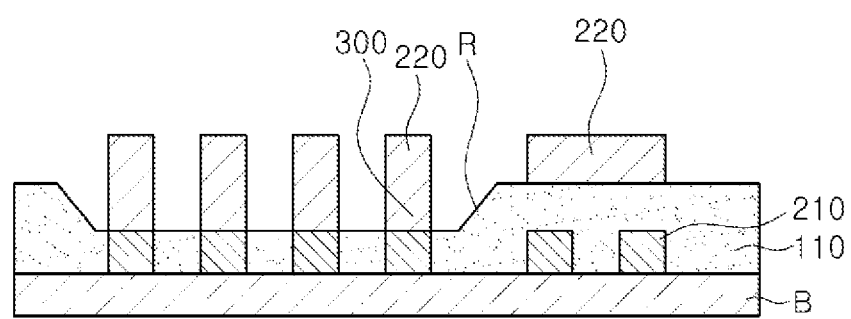

Referring to FIG. 10, the remaining dry film D may also be developed and removed. After the dry film D is removed as described above, the second circuit pattern 220 and the via 300 may remain. This is advantageous in securing design freedom as compared with plating performed after forming a via hole in an insulating material through laser processing. That is, according to the present disclosure, since a region for disposing the second circuit pattern 220 and the via 300 is secured through the process of exposing and developing the photosensitive material, which is relatively easier to control than the laser processing, the shape of the second circuit pattern 220 and the via 300 can be controlled according to design. In the case of FIG. 10, the second circuit pattern 220 and the via 300 may form sharing surfaces with the exposed surface and the side surface of the first circuit pattern 210, and may have a relatively straight shape rather than a tapered shape. That is, the upper and lower surfaces of the via 300 may have a substantially equal cross-sectional area, and the second circuit pattern 220 disposed on an upper side of the via 300 may also have a line width substantially equal to that of the via 300.

Figure 11:
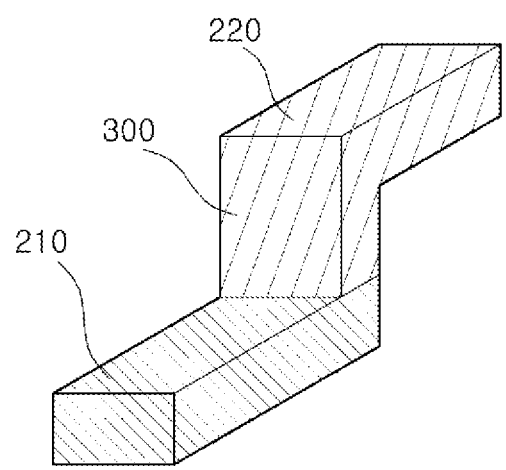
FIG. 11 is an enlarged view illustrating circuit patterns and a via of the printed circuit board of FIG. 3.

FIG. 11 is an enlarged view illustrating the circuit patterns and the via of the printed circuit board of FIG. 3.

FIG. 11 schematically illustrates the shapes of the first and second circuit patterns 210 and 220 and the via 300 according to the present disclosure. As the present disclosure adopts a plating process performed after the process of exposing and developing the photosensitive material, rather than laser processing, the via 300 may have a polygonal shape with non-circular corners in a cross section. As an example, as illustrated in FIG. 11, the via 300 may have a rectangular shape in a horizontal-direction cross section. In addition, at least a portion of the side surface of the first circuit pattern 210 may be coplanar with at least a portion of the side surface of the via 300, and may also be coplanar with at least a portion of the side surface of the second circuit pattern 220. In addition, there may be an interface between respective plating layers of the first circuit pattern 210 and the via 300 because they are formed through separate plating processes, but there may be no interface between the second circuit pattern 220 and the via 300 because they are integrally formed.

When formed in a typical manner through laser processing, a via is tapered in a cylindrical or truncated-cone shape. In such a case that the cross-sectional area of the via is not uniform, it is highly likely that defective plating may occur in a region where the via has a smaller cross-sectional area, for example, in a region where the via contacts a land disposed on the lower side of the via. When a crack occurs in the region where the via contacts the land disposed on the lower side of the via, the insulating material may permeate into the crack between the plating layers, thereby causing delamination of plating or signal failure.

According to the present disclosure, since the via 300 is formed using a photosensitive resist, not based on laser processing, the via 300 can be formed to have a uniform cross-sectional area, thereby making it possible to secure a sufficient contact area between the via 300 and the first circuit pattern 210 and prevent the aforementioned defects including the crack and delamination in advance.

In addition, in a case where a via is formed in a typical manner through laser processing, in order to prevent damage to a lower pattern by laser, it is required to form a land and a pad in a wide area. In contrast, according to the present disclosure, since laser is not used to form via holes, lands and pads can be omitted, and as a result, it is possible to secure an area allowing more wiring layers to be disposed therein, thereby achieving microcircuit patterns.

Figure 12:
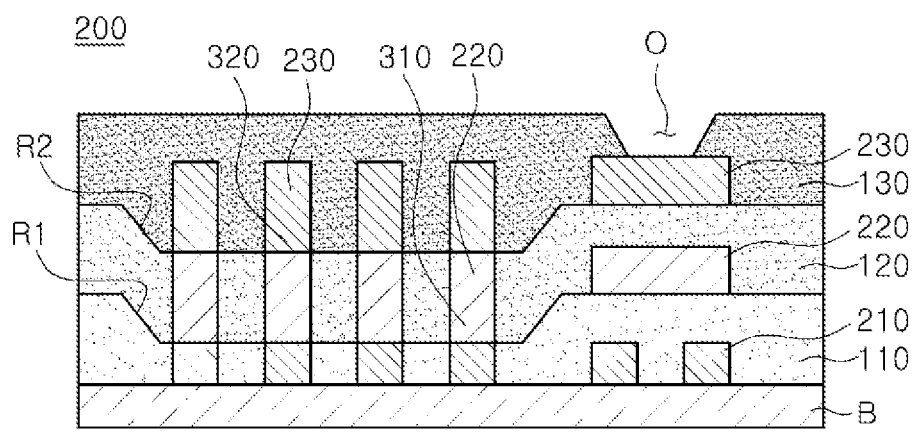
FIG. 12 is a cross-sectional view schematically illustrating a modified exemplary embodiment of the printed circuit board of FIG. 3.

FIG. 12 is a cross-sectional view schematically illustrating a modified exemplary embodiment of the printed circuit board of FIG. 3.

FIG. 12 illustrates a modified exemplary embodiment 200 of the printed circuit board of FIG. 3. According to the modified exemplary embodiment, one surface of the second insulating layer 120 may also be processed through a skiving process to form a second recess portion R2, thereby exposing at least a portion of an upper surface of the second circuit pattern 220.

A second via 320 and a third circuit pattern 230 may be further disposed on the upper surface of the second circuit pattern 220 exposed to the second recess R2. The second via 320 and the third circuit pattern 230 may be disposed using a photosensitive resist, and then a third insulating layer 130 may fill the second recess R2 while covering the second via 320 and the third circuit pattern 230. Thereafter, an opening O for connection to another external component may be formed in one surface of the third insulating layer 130 to expose at least a portion of the third circuit pattern 230 to the outside. An electrical connection metal such as a solder or a bump may be disposed on the exposed third circuit pattern 230 to be electrically connected to another component such as an external electronic component.

Concerning the third circuit pattern 230, the description of the first and second circuit patterns 210 and 220 provided above is identically applicable, and the third insulating layer 130 in which the opening O is formed may be a solder resist layer including a photosensitive insulating material.

As set forth above, as one effect of the present disclosure, it is possible to provide a printed circuit board capable of achieving a microcircuit.

As another effect of the present disclosure, it is possible to provide a printed circuit board capable of reducing processing costs and processing time.

As another effect of the present disclosure, it is possible to provide a printed circuit board advantageous in improving circuit density.

As another effect of the present disclosure, it is possible to provide a printed circuit board capable of preventing defects caused by via plating or delamination.

While exemplary embodiments have been shown and described above, it will be apparent to those skilled in the art that modifications and variations could be made without departing from the scope of the present invention as defined by the appended claims.

What is claimed is:

1. A printed circuit board comprising:
a first insulating layer having a recess portion in one surface of the first insulating layer;
a first circuit pattern embedded in the first insulating layer and being in contact with a lower surface of the recess portion;
a second insulating layer disposed on the one surface of the first insulating layer to be disposed in at least a portion of the recess portion; and
a via penetrating through at least a portion of the second insulating layer, disposed in the recess portion, and connected to the first circuit pattern,
wherein the recess portion is spaced apart from edges of the printed circuit board, such that portions of the first insulating layer, disposed at opposing sides of the recess portion, each have a thickness greater than a portion of the first insulating layer under the recess portion.

2. The printed circuit board of claim 1, wherein an upper surface of the first circuit pattern is in contact with the lower surface of the recess portion and is coplanar with the lower surface of the recess portion.

3. The printed circuit board of claim 1, further comprising a second circuit pattern disposed on at least one of the one surface of the first insulating layer and the via.

4. The printed circuit board of claim 3, wherein the via contacts an upper surface of the first circuit pattern in contact with the lower surface of the recess portion.

5. The printed circuit board of claim 4, wherein a plurality of first circuit patterns in contact with the lower surface of the recess portion are disposed to be spaced apart from each other, and
the via is disposed on each of the plurality of first circuit patterns disposed to be spaced apart from each other on the lower surface of the recess portion.

6. The printed circuit board of claim 3, wherein a side surface of the via is coplanar with a side surface of the second circuit pattern connected to the via.

7. The printed circuit board of claim 6, wherein the side surface of the via is coplanar with a side surface of the first circuit pattern connected to the via.

8. The printed circuit board of claim 3, wherein the via has a polygonal shape with corners in a cross section perpendicular to a stacking direction of the via and the first circuit pattern.

9. The printed circuit board of claim 1, wherein the via has a substantially equal cross-sectional area from an upper surface to a lower surface of the via.

10. The printed circuit board of claim 1, wherein the first circuit pattern extends from the other surface of the first insulating layer.

11. The printed circuit board of claim 1, wherein the recess portion is tapered to have a smaller cross-sectional area as being closer to the other surface of the first insulating layer.

12. A printed circuit board comprising:
a first insulating layer having a recess portion in one surface of the first insulating layer;
a first circuit pattern embedded in the first insulating layer and being in contact with a lower surface of the recess portion;
a second circuit pattern disposed on the one surface of the first insulating layer; and
a plurality of vias spaced apart from each other in the recess portion, each connecting the first and second circuit patterns to each other,
wherein the recess portion is spaced apart from edges of the printed circuit board, such that portions of the first insulating layer, disposed at opposing sides of the recess portion, each have a thickness greater than a portion of the first insulating layer under the recess portion.

13. The printed circuit board of claim 12, further comprising: a second insulating layer disposed on the one surface of the first insulating layer to be disposed in at least a portion of the recess portion,
wherein an interface between the first and second insulating layers in the recess portion is coplanar with an interface between the first circuit pattern and each of the plurality of vias.

14. The printed circuit board of claim 12, wherein an upper surface of each of the plurality of vias contacts the second circuit pattern,
a lower surface of each of the plurality of vias contacts the first circuit pattern, and
the upper surface and the lower surface of each of the plurality of vias have a substantially equal cross-sectional area.

15. The printed circuit board of claim 13, wherein the plurality of vias penetrate through the second insulating layer in the recess portion.

16. A printed circuit board comprising:
a first insulating layer having a recess portion in one surface of the first insulating layer;
a second insulating layer disposed on the one surface of the first insulating layer and including a portion disposed in the recess portion;
a plurality of first circuit patterns spaced apart from each other in the first insulating layer, and extending from the recess portion;
a plurality of second circuit patterns embedded in the second insulating layer; and a plurality of vias spaced apart from each other in the recess portion, and respectively extending from the plurality of first circuit patterns to the plurality of second circuit patterns, wherein the recess portion is spaced apart from edges of the printed circuit board, such that portions of the first insulating layer, disposed at opposing sides of the recess portion, each have a thickness greater than a portion of the first insulating layer under the recess portion.

17. The printed circuit board of claim 16, wherein the plurality of first circuit patterns are arranged in one direction, and the recess portion extends in the one direction.

18. The printed circuit board of claim 16, wherein an interface between one of the plurality of first circuit patterns and one of the plurality of vias is coplanar with an interface between the first insulating layer and the second insulating layer in the recess portion.

19. The printed circuit board of claim 16, wherein a side surface of one of the plurality of vias is coplanar with a side surface of one of the plurality of second circuit patterns.

* * * * *